(12) United States Patent
Fu et al.

(10) Patent No.: US 10,199,404 B2
(45) Date of Patent: Feb. 5, 2019

(54) ARRAY SUBSTRATE AND MANUFACTURING METHOD THEREOF AND DISPLAY DEVICE

(71) Applicants: BOE Technology Group Co., Ltd., Beijing (CN); Hefei BOE Optoelectronics Technology Co., Ltd., Hefei (CN)

(72) Inventors: Xiuxing Fu, Beijing (CN); Zhen Wei, Beijing (CN); Feng Li, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/697,660

(22) Filed: Sep. 7, 2017

(65) Prior Publication Data

US 2018/0190685 A1     Jul. 5, 2018

(30) Foreign Application Priority Data

Jan. 4, 2017   (CN) .......................... 2017 1 0004838

(51) Int. Cl.
*H01L 27/12*     (2006.01)
*G02F 1/1362*    (2006.01)
*G02F 1/1343*    (2006.01)
*H01L 27/32*     (2006.01)

(52) U.S. Cl.
CPC .... *H01L 27/1262* (2013.01); *G02F 1/134309* (2013.01); *G02F 1/136227* (2013.01); *G02F 1/136277* (2013.01); *G02F 1/136286* (2013.01); *H01L 27/124* (2013.01); *H01L 27/3248* (2013.01); *H01L 27/3276* (2013.01); *G02F 2201/123* (2013.01)

(58) Field of Classification Search
CPC ............... H01L 27/1262; H01L 27/124; H01L 27/3248
See application file for complete search history.

(56) References Cited

U.S. PATENT DOCUMENTS

| | | | | |
|---|---|---|---|---|
| 6,157,354 A | * | 12/2000 | Amemiya | ................ H01J 11/12 |
| | | | | 315/169.4 |
| 2002/0067322 A1 | * | 6/2002 | Yanagawa | ......... G02F 1/134363 |
| | | | | 345/87 |
| 2003/0179331 A1 | * | 9/2003 | Kurahashi | ......... G02F 1/134363 |
| | | | | 349/122 |

(Continued)

*Primary Examiner* — Errol Fernandes
(74) *Attorney, Agent, or Firm* — Banner & Witcoff, Ltd.

(57) ABSTRACT

An array substrate, a manufacturing method thereof and a display device are provided by the present disclosure. The manufacturing method includes: providing a base substrate; forming a plurality of pixel electrodes on the base substrate, in which the operation of forming the plurality of pixel electrodes includes: depositing a first transparent conductive film, and forming the plurality of pixel electrodes and a connection unit for connecting adjacent pixel electrodes by patterning the first transparent conductive film; forming a passivation layer on the plurality of pixel electrodes, and patterning the passivation layer to expose at least a portion of the connection unit; and processing the exposed portion of the connection unit, so that the plurality of interconnected pixel electrodes are electrically insulated.

12 Claims, 6 Drawing Sheets

(56) References Cited

U.S. PATENT DOCUMENTS

2011/0017524 A1* 1/2011 Chen ...................... G06F 3/044
　　　　　　　　　　　　　　　　　　　　　　178/18.06
2013/0008704 A1* 1/2013 Chang .................... G06F 3/041
　　　　　　　　　　　　　　　　　　　　　　174/262
2014/0014982 A1* 1/2014 Liu .................. G02F 1/136259
　　　　　　　　　　　　　　　　　　　　　　257/89

* cited by examiner

ARRAY SUBSTRATE AND MANUFACTURING METHOD THEREOF AND DISPLAY DEVICE

This application claims priority to and the benefit of Chinese Patent Application No. 201710004838.1 filed on Jan. 4, 2017, which application is incorporated herein in its entirety.

TECHNICAL FIELD

Embodiments of the present disclosure relate to an array substrate, a manufacturing method thereof, and a display device comprising the array substrate.

BACKGROUND

Thin film transistor liquid crystal displays (TFT-LCDs) have advantages of small size, low power consumption and no radiation, etc, and the thin film transistor liquid crystal displays play a dominant role in the flat-panel display field. In the manufacturing process of the TFT-LCDs, after a plurality of array substrates are manufactured on a base substrate, in order to guarantee the quality of the product, pixels in the array substrates should be detected by a detection device, so as to avoid the production of defective products in the subsequent production processes.

For example, in a case that data lines and a source/drain electrode layer (including source electrodes and drain electrodes) are formed on pixel electrodes after the pixel electrodes are formed, or in a case that pixel electrodes are formed on data lines and a source/drain electrode layer after the data lines and the source/drain electrode layer (including source electrodes and drain electrodes) are formed, a problem of short circuit tends to be generated between the data lines and the pixel electrodes, which causes the pixels to be poor, and more seriously, a poor line conduction is caused. Thus, the TFT-LCDs cannot be used normally.

SUMMARY

At least one embodiment of the present disclosure provides a method for manufacturing an array substrate, and the method comprises: providing a base substrate; and forming a plurality of gate lines, a plurality of data lines, and a plurality of pixel electrodes on the base substrate, wherein the plurality of gate lines and the plurality of data lines are intersected with each other to define a plurality of pixel regions, the plurality of pixel electrodes are in the plurality of pixel regions respectively; and forming of the plurality of pixel electrodes comprises: depositing a first transparent conductive film on the base substrate; forming the plurality of pixel electrodes and a connection unit for connecting adjacent pixel electrodes by patterning the first transparent conductive film; forming a passivation layer on the plurality of pixel electrodes, and patterning the passivation layer to expose at least a portion of the connection unit; and processing the exposed portion of the connection unit, to render the plurality of interconnected pixel electrodes to be electrically insulated.

For example, in the manufacturing method provided by at least one embodiment of the present disclosure, the connection unit is intersected or overlapped with one of the gate lines disposed between the adjacent pixel electrodes.

For example, in the manufacturing method provided by at least one embodiment of the present disclosure, the pixel electrodes are block electrodes, slit-like electrodes or comb-like electrodes.

For example, the manufacturing method provided by at least one embodiment of the present disclosure further comprises: forming a source electrode and a drain electrode on the base substrate, wherein the source electrode is connected with one of the data lines, and the drain electrode is connected with one of the pixel electrodes.

For example, the manufacturing method provided by at least one embodiment of the present disclosure further comprises: forming a common electrode on the passivation layer.

For example, the manufacturing method provided by at least one embodiment of the present disclosure further comprises: forming a through hole in the passivation layer, wherein at least the portion of the connection unit is exposed at the through hole.

For example, in the manufacturing method provided by at least one embodiment of the present disclosure, the portion of the connection unit exposed by the through hole is processed, to render the plurality of interconnected pixel electrodes to be electrically insulated.

At least one embodiment of the present disclosure further provides an array substrate, and the array substrate comprises: a base substrate; a plurality of gate lines, a plurality of data lines, and a plurality of pixel electrodes disposed on the base substrate; and a passivation layer disposed on the plurality of pixel electrodes, wherein the plurality of gate lines and the plurality of data lines are intersected with each other to define a plurality of pixel regions, the plurality of pixel electrodes are in the plurality of pixel regions respectively; the passivation layer is provided with a through hole and the through hole is disposed between adjacent pixel electrodes, and the adjacent pixel electrodes are electrically insulated with each other at the through hole.

For example, in the array substrate provided by at least one embodiment of the present disclosure, at least a portion of the through hole corresponds to one of the gate lines disposed between the adjacent pixel electrodes in a direction perpendicular to the base substrate.

For example, in the array substrate provided by at least one embodiment of the present disclosure, the pixel electrodes are block electrodes, slit-like electrodes or comb-like electrodes.

For example, the array substrate provided by at least one embodiment of the present disclosure may further comprise a source electrode and a drain electrode disposed on the base substrate, wherein the source electrode is connected with one of the data lines, and the drain electrode is connected with one of the pixel electrodes.

For example, the array substrate provided by at least one embodiment of the present disclosure may further comprise a common electrode disposed on the passivation layer.

For example, in the array substrate provided by at least one embodiment of the present disclosure, the common electrode is provided with an opening corresponding to the through hole in a direction perpendicular to the base substrate.

At least one embodiment of the present disclosure further provides a display device, and the display device comprises any one of the array substrate described above.

BRIEF DESCRIPTION OF THE DRAWINGS

In order to clearly illustrate the technical solution of the embodiments of the disclosure or the prior art, the drawings of the embodiments or description in the prior art will be briefly described in the following. It is obvious that the described drawings are only related to some embodiments of the disclosure, and those skilled in the art can also obtain other drawings without any inventive work according to the drawings.

FIG. 1 is a flow diagram of a method for manufacturing an array substrate.

DETAILED DESCRIPTION

In order to make objects, technical details and advantages of the embodiments of the present disclosure apparent, the technical solutions in the embodiments of the present disclosure will be described in a clearly and fully understandable way in connection with the drawings related to the embodiments of the disclosure. It is obvious that the described embodiments are just a part but not all of the embodiments of the disclosure. Based on the embodiments in the disclosure, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
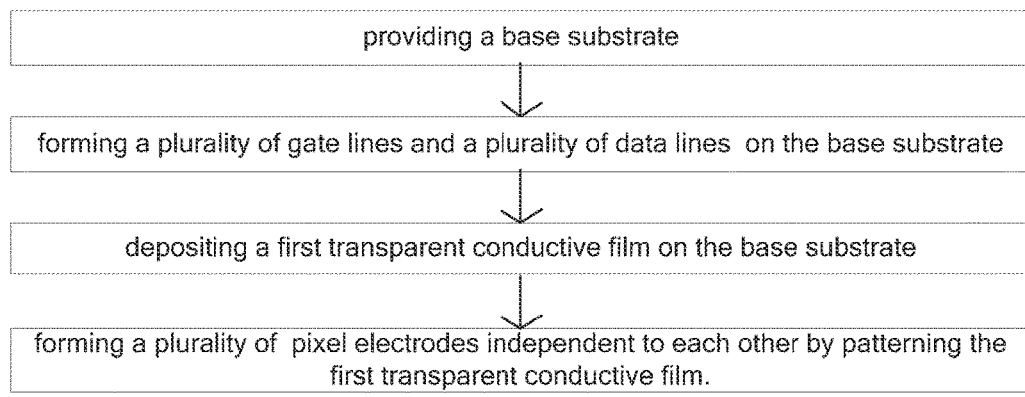

In an array of pixel regions (or pixel units) of an array substrate manufactured by the conventional manufacturing process, pixel electrodes are independently distributed and are not connected with each other. FIG. 1 is a flow diagram of a method for manufacturing an array substrate. The manufacturing method comprises: providing a base substrate; forming a plurality of gate lines and a plurality of data lines on the base substrate; depositing a first transparent conductive film on the base substrate; and forming a plurality of pixel electrodes which are independent to each other by patterning the first transparent conductive film.

Figure 2:
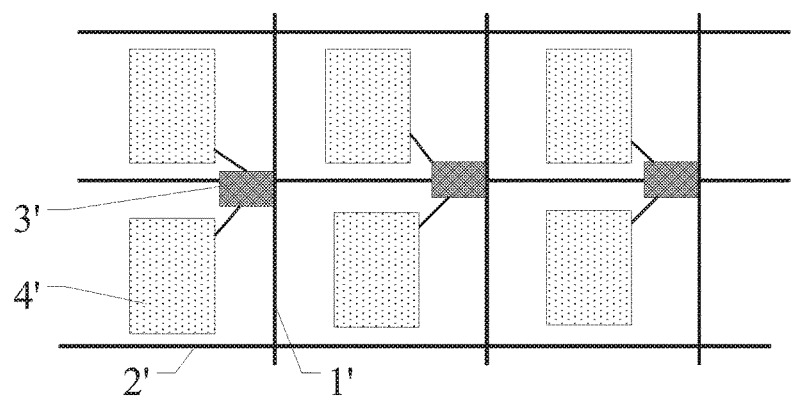
FIG. 2 is a schematic diagram of a plane structure of an array substrate.

For example, FIG. 2 is a schematic diagram of a plane structure of an array substrate. The array substrate is manufactured by the manufacturing method as illustrated in FIG. 1. As illustrated in FIG. 2, gate lines 1' and data lines 2' are intersected with each other to define pixel regions; thin-film transistors (TFTs) 3' are disposed at intersected positions of the gate lines 1' and the data lines 2; and pixel electrodes 4' are disposed in the pixel regions. The problem of short circuit tends to be generated between the pixel electrodes 4' and the data lines 2', or the pixel electrodes may cross the data lines and the problem of short circuit tends to be generated between the pixel electrodes. The pixel electrodes are independent to each other. In a case that signals on the data lines are transmitted to the pixel electrodes, the signals cannot be transmitted between the pixel electrodes, so the signals on the data lines are not reduced obviously. In a case that a testing instrument is adopted to test the signals on the data lines, even there is a poor electrical conduction between the pixel electrodes and the data lines, the problem of poor electrical conduction cannot be detected. In addition, as the pixel electrodes are made of transparent conductive materials (for example, indium tin oxide (ITO), indium zinc oxide (IZO), etc.), the pixel electrodes are transparent. In a case that an optical device is adopted for detecting an array structure and repairing of the array structure in subsequent, the detection process is complex and it is difficult and cumbersome to repair, and other poor problems may also tend to be generated after repairing.

As described above, the pixel electrodes are independent to each other. In a case that a testing instrument is adopted to test signals on the data lines, even there is a poor electrical conduction between the pixel electrodes and the data lines, the problem of the poor electrical conduction cannot be detected.

At least one embodiment of the present disclosure provides a method for manufacturing an array substrate. The manufacturing method comprises: providing a base substrate; and forming a plurality of gate lines, a plurality of data lines, and a plurality of pixel electrodes on the base substrate. The plurality of gate lines and the plurality of data lines are intersected with each other to define a plurality of pixel regions. The plurality of pixel electrodes are disposed in the plurality of pixel regions respectively. Forming of the plurality of pixel electrodes comprises: depositing a first transparent conductive film on the base substrate; forming the plurality of pixel electrodes and a connection unit for connecting adjacent pixel electrodes by patterning the first transparent conductive film; forming a passivation layer on the plurality of pixel electrodes, and patterning the passivation layer to expose at least a portion of the connection unit; and processing the exposed portion of the connection unit to render the plurality of interconnected pixel electrodes to be electrically insulated.

In the manufacturing process of the array substrate provided by the embodiment, all the pixel electrodes are connected in series through the connection units to form a linear electrode structure. In a case that a short circuit problem is generated between the data lines and the pixel electrodes or between the data lines and the connection units, it is equivalent to the short circuit problem is generated between two wires; and signals on the data lines are transmitted on the pixel electrodes and the connection units, the intensity of the signals on the data lines is greatly reduced, so that it is convenient for the detection of the array substrate by a detection device. In addition, the connection units and the pixel electrodes are formed in a same layer and made of a same material, so the forming of the connection units does not require an additional processing operation. For example, after both a source/drain electrode layer (including source electrodes and drain electrodes) and the pixel electrodes are formed, the connection units may also be removed in the process of forming the passivation layer and common electrodes, so the pixel electrodes in the pixel regions can be independent to each other and operate normally, and no additional process is required.

Figure 3A:
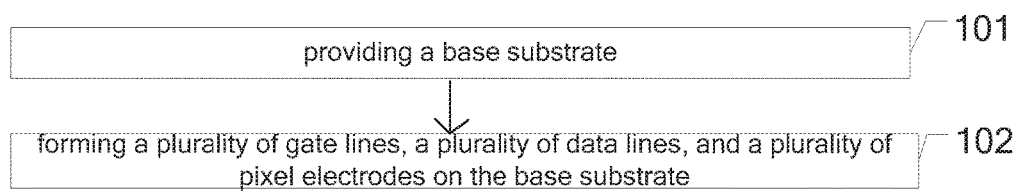
FIG. 3a is a flow diagram of a method for manufacturing an array substrate provided by an embodiment of the present disclosure.

At least one embodiment of the present disclosure provides a method for manufacturing an array substrate. FIG. 3a is a flow diagram of a method for manufacturing an array substrate provided by an embodiment of the present disclosure. The manufacturing method comprises the following operations:

S101: providing a base substrate.

S102: forming a plurality of gate lines, a plurality of data lines, and a plurality of pixel electrodes on the base substrate.

For example, the plurality of gate lines and the plurality of data lines are intersected with each other to define a plurality of pixel regions, and the plurality of pixel electrodes are in the plurality of pixel regions respectively. The process of forming the array substrate may also comprise the operation of forming the data lines and a source/drain electrode layer (comprising source electrodes and drain electrodes) of TFTs on the pixel electrodes after the pixel electrodes are formed, and may also comprise the operation of forming the pixel electrodes on the data lines and the source/drain electrode layer (comprising the source electrodes and the drain electrodes) after the data lines and the source/drain electrode layer (comprising the source electrodes and the drain electrodes) of the TFTs are formed.

Figure 3B:
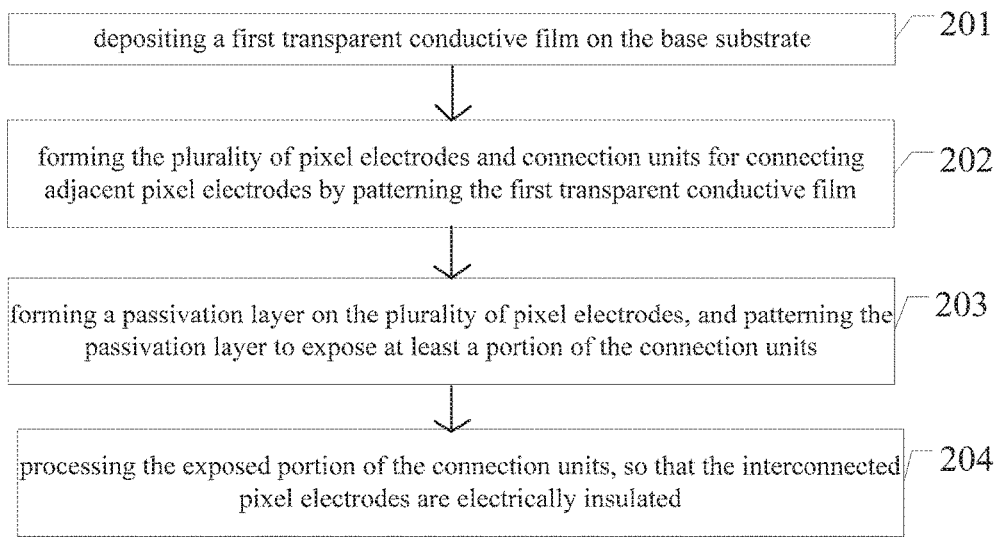
FIG. 3b is a flow diagram of a method for manufacturing pixel electrodes provided by an embodiment of the present disclosure.

FIG. 3b is a flow diagram of a method for manufacturing pixel electrodes provided by an embodiment of the present disclosure. For example, the process of forming the plurality of pixel electrodes comprises the following operations:

S201: depositing a first transparent conductive film on the base substrate.

S202: forming the plurality of pixel electrodes and connection units for connecting adjacent pixel electrodes by patterning the first transparent conductive film.

S203: forming a passivation layer on the plurality of pixel electrodes, and patterning the passivation layer to expose at least a portion of the connection units.

S204: processing the exposed portion of the connection units to render the interconnected pixel electrodes to be electrically insulated.

For example, the above process comprises: etching the exposed portion of the connection units to render the plurality of interconnected pixel electrodes to be disconnected; or removing the exposed portion of the connection units by an ashing process to render the plurality of interconnected pixel electrodes to be disconnected; or performing a doping treatment on the exposed portion of the connection units to render the plurality of interconnected pixel electrodes to be electrically insulated. Description will be given below by taking the case of etching the exposed portion of the connection units so as to disconnect the plurality of interconnected pixel electrodes as an example.

For example, in order to describe the manufacturing process of the array substrate more clearly, FIGS. 4a to 4i illustrate the schematic diagrams of the manufacturing process of the array substrate provided by an embodiment of the present disclosure. For example, description is given in the manufacturing process by taking the case of forming the pixel electrodes on the data lines and the source/drain electrode layer (including the source electrodes and the drain electrodes) after the data lines and the source/drain electrode layer (including the source electrodes and the drain electrodes) are formed as an example.

Figure 4A:
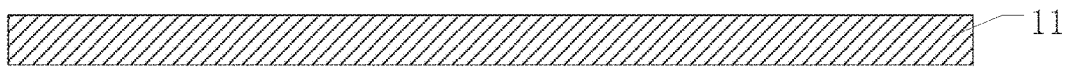
FIGS. 4a to 4i are schematic diagrams of the manufacturing process of the array substrate provided by an embodiment of the present disclosure.

As illustrated in FIG. 4a, a base substrate 11 is provided. For example, the base substrate 11 is an insulating substrate and the base substrate may be made of glass, quartz, resin materials with a certain hardness, or other suitable materials.

Figure 4B:

As illustrated in FIG. 4b, gate lines 1 and gate electrodes 12 are formed on the base substrate 11. The gate electrodes 12 are branched structures of the gate lines 1, and gate signals are applied to the gate electrodes 12 through the gate lines 1.

For example, the forming process of the gate electrodes 12 and the gate lines 1 comprises: depositing a layer of gate metal film on the base substrate 11 in a vapor deposition method, a magnetron sputtering method or a vacuum vaporization method, etc. The gate metal film is made of one or more selected from the group consisting of titanium (Ti), tantalum (Ta), copper (Cu), aluminum (Al), molybdenum (Mo) and chromium (Cr), or one or more of alloys formed by any combinations of the above metals. For example, the gate metal layer is made of a combination of Cu and other metals, for example, copper/molybdenum alloy (Cu/Mo), copper/titanium alloy (Cu/Ti), copper/molybdenum titanium alloy (Cu/MoTi), copper/molybdenum tungsten alloy (Cu/MoW) or copper/molybdenum niobium alloy (Cu/MoNb). The gate metal layer is made of a Cr-base metal or a combination of Cr and other metals, for example, chromium/molybdenum alloy (Cr/Mo), chromium/titanium alloy (Cr/Ti) or chromium/molybdenum titanium alloy (Cr/MoTi). The gate metal layer may be made of Al or Al alloy, etc.

For example, the gate metal film may be a single-layer or a multi-layer structure, and correspondingly, the gate electrodes 12 and the gate lines 1 may be a single-layer or a multi-layer structure. A photoresist pattern (not shown) is formed at positions of the gate metal film, at which patterns of the gate electrodes are to be formed; the patterns of the gate electrodes 12 are formed by etching the gate metal film and using the photoresist pattern as a mask; and the remaining photoresist is stripped off.

Figure 4C:
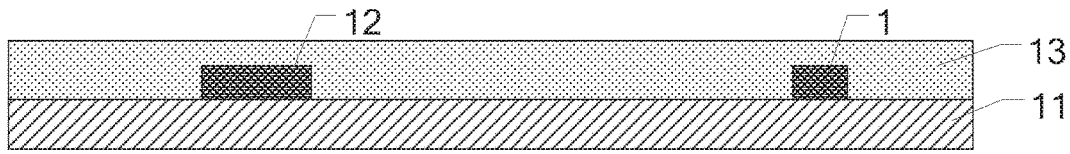

As illustrated in FIG. 4c, a gate insulating layer film is deposited on the base substrate provided with the gate electrodes 12 and the gate lines 1; a layer of photoresist (not shown) is coated on the gate insulating layer film; and a pattern of the gate insulating layer 13 is formed by processes of exposure, development, etching and stripping off the remaining photoresist.

For example, the gate insulating layer film is made of silicon nitride ($SiN_x$), silicon oxide ($SiO_x$), aluminum oxide ($Al_2O_3$), aluminum nitride (AlN) or other suitable materials.

Figure 4D:
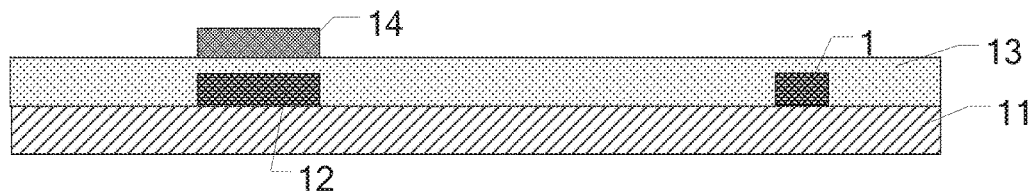

As illustrated in FIG. 4d, a semiconductor layer film is deposited on the base substrate 11 provided with the gate electrodes 12, the gate lines 1 and the gate insulating layer 13; a layer of photoresist (not shown) is coated on the semiconductor layer film; and patterns of active layers 14 are formed by processes of exposure, development, etching and stripping off the remaining photoresist.

For example, the active layers 14 are disposed on the gate insulating layer 13 and correspond to the gate electrodes 12. The active layers 14 are made of amorphous silicon (a-Si), metal oxide semiconductors or organic semiconductors, etc. For example, the metal oxide semiconductors used for forming the active layers may comprise: indium gallium zinc oxide (IGZO), indium zinc oxide (IZO), zinc oxide (ZnO), gallium zinc oxide (GZO), etc. The metal oxide semiconductor layer may be deposited in a magnetron sputtering method. The organic semiconductors used for forming the active layers may comprise: metal organic compounds or polymers such as polyphenyl, polyacetylene, polyvinyl carbazole and polyphenylene sulfide.

Figure 4E:
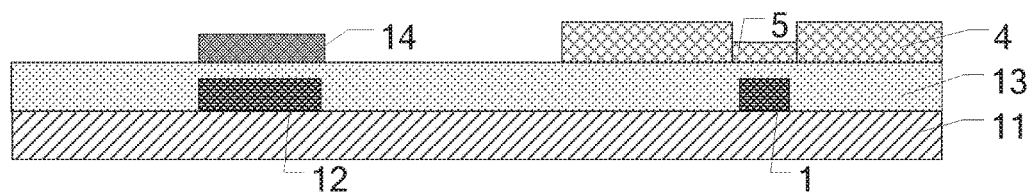

As illustrated in FIG. 4e, pixel electrodes 4 connected with each other through connection units 5 are formed on the base substrate 11 provided with the gate electrodes 12, the gate lines 1, the gate insulating layer 13 and the active layers 14. The pixel electrodes 4 may be made of transparent conductive materials such as ITO, IZO, IGO, GZO, carbon nanotube, ZnO, indium oxide ($In_2O_3$) and aluminum zinc oxide (AZO). For example, a first transparent conductive film may be deposited in a magnetron sputtering method; a layer of photoresist (not shown) is coated on the first transparent conductive film; and patterns of the pixel electrodes 4 and the connection units 5 are formed by processes such as exposure, development, etching and stripping off the remaining photoresist.

As illustrated in FIG. 4e, the pixel electrodes 4 and the active layers 14 are arranged in the same layer and the pixel electrodes 4 are spaced apart from the active layers 14.

For example, in the above processes, a spin coating method, a blade coating method or a roll coating method may be adopted to coat the photoresist.

Figure 4F:
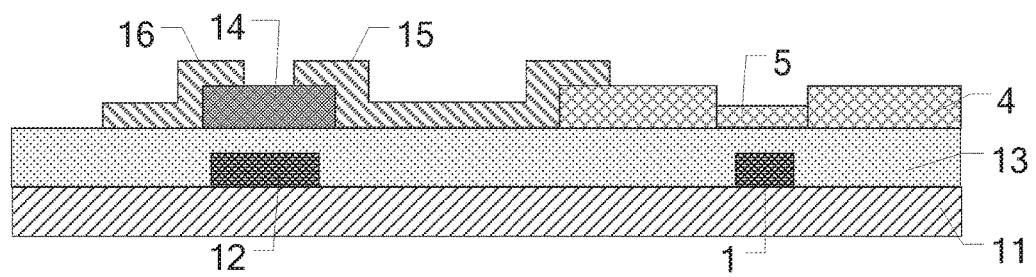

As illustrated in FIG. 4f, a source/drain metal layer film is deposited on the active layers 14. The source/drain metal layer film is made of Cu, Cu alloy, Al, Al alloy, Mo, Mo alloy or other suitable materials. For example, a Cu-base metal is adopted. The Cu-base metal has the characteristics of low electric resistivity and good electric conductivity. The source electrodes and the drain electrodes made of the Cu-base metal can improve the signal transmission rate of the source electrodes and the drain electrodes and hence the display quality is improved. The Cu-base metal is Cu, copper-zinc alloy (CuZn), copper-nickel alloy (CuNi), copper-zinc-nickel alloy (CuZnNi) or other Cu-base metal alloy with stable performances.

For example, a layer of photoresist (not shown) is coated on the source/drain metal layer film, and patterns of source electrodes 16 and drain electrodes 15 are formed by processes such as exposure, development, etching and stripping off the remaining photoresist. In the process of forming the source electrodes 16 and the drain electrodes 15 by patterning the source/drain metal layer film, the data lines (not shown) are also formed.

For example, a thickness of the source/drain metal layer film may be 200 nm to 400 nm, for example, may be 200 nm, 230 nm, 250 nm, 300 nm, 350 nm, 380 nm or 400 nm.

For example, in the manufacturing process, the connection units 5 and the gate lines are intersected or overlapped with each other in space. Two adjacent pixel electrodes 4 are connected with each other through one of the connection units 5. Orthographic projections of the connection units 5 on the base substrate 11 are intersected or overlapped with orthographic projections of the gate lines 1 on the base substrate 11 (with reference to an A-A' line in FIG. 5).

The adjacent pixel electrodes 4 are connected in series by the connection unit 5. The plurality of pixel electrodes 4 are connected in series by the plurality of connection units 5 to form a linear structure. In a case that a short circuit problem is generated between the data lines and the pixel electrodes or between the data lines and the connection units, it is equivalent to the short circuit problem is generated between two wires; and signals on the data lines are transmitted on the pixel electrodes and the connection units, the intensity of the signals on the data lines is greatly reduced, so that it is convenient for the detection of the array substrate by a detection device. Thus, the problem of poor electrical conduction can be easily detected.

For example, in the manufacturing method provided by the embodiment of the present disclosure, the pixel electrodes are block electrodes; the block pixel electrodes are formed in corresponding pixel regions respectively; and the plurality of block pixel electrodes 4 are connected in series through the plurality of connection units 5.

Figure 5:
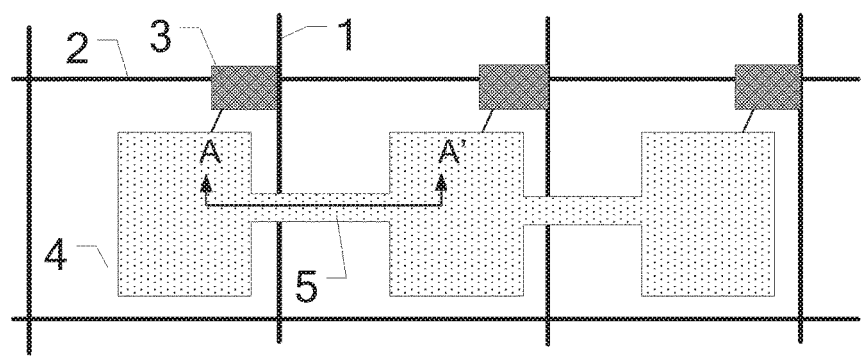
FIG. 5 is a schematic diagram of a plane structure of an array substrate after completion of operation 4f in the manufacturing process provided by an embodiment of the present disclosure.

For example, FIG. 5 is a schematic diagram of a plane structure of an array substrate after completion of operation 4f in the manufacturing process provided by an embodiment of the present disclosure. In an intermediate structure of the array substrate, four gate lines 1 and two data lines 2 are intersected with each other to define the pixel regions; TFTs 3 are disposed at intersected positions of the gate lines 1 and the data lines 2; pixel electrodes 4 are formed in the pixel regions; each of the pixel electrodes 4 has a blocky structure; and the adjacent pixel electrodes 4 are connected with each other through one of the connection units 5. For example, orthographic projections of the connection units 5 on the base substrate are intersected or overlapped with orthographic projections of the gate lines 1 on the base substrate. As illustrated in the FIG. 5, the widths of the connection units 5 in an extension direction of the gate lines are less than those of the pixel electrodes 4, so that it is convenient to form small through holes in the subsequent processes for etching and disconnecting the connection units. In addition, although the FIG. 5 only illustrates the case of forming one connection unit 5 between the adjacent pixel electrodes 4, for example, two connection units may further be formed between adjacent pixel electrodes 4, and the connection units are disconnected in the subsequent operations.

In the embodiment of the present disclosure, the pixel electrodes are not limited to be block electrodes, for example, the pixel electrodes may be slit-like electrodes (having closed and/or open slits) or comb-like electrodes, etc.

It should be noted that, the TFTs 3 may be bottom-gate TFTs, and the TFTs 3 may also be top-gate TFTs. FIG. 5 only illustrates four gate lines and two data lines, and more gate lines 1 and more data lines 2 may be disposed on the base substrate.

As illustrated in FIG. 4f, the source electrodes 16 are connected with the data lines, and the drain electrodes 15 are connected with the pixel electrodes 4. For example, the drain electrodes may be connected with the pixel electrodes directly. Or an insulating layer is formed on the source electrodes, the drain electrodes and the data lines, and the insulating layer is patterned to form through holes in the insulating layer; subsequently, the pixel electrodes are formed on the insulating layer; and the drain electrodes are connected with the pixel electrodes via the through holes formed in the insulating layer. Description is given in the embodiment of the present disclosure by taking the direct connection of the drain electrodes and the pixel electrodes as an example.

Figure 4G:
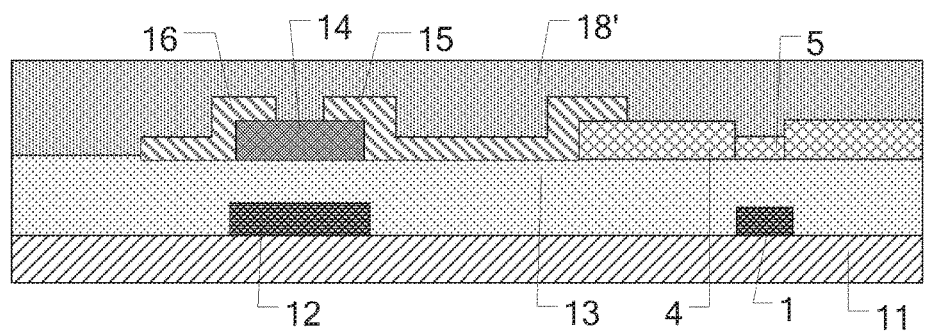

As illustrated in FIG. 4g, a passivation layer film 18' is deposited on the source electrodes 16, the drain electrodes 15 and the pixel electrodes 4 to cover the source electrodes 16, the drain electrodes 15, the pixel electrodes 4, the gate electrodes 12, the gate insulating layer 13 and the active layers 14. The passivation layer film 18' plays a role of protection and insulation. For example, the passivation layer film 18' may be made of $SiN_x$, $SiO_x$ and acrylic resin, etc.

Figure 4H:
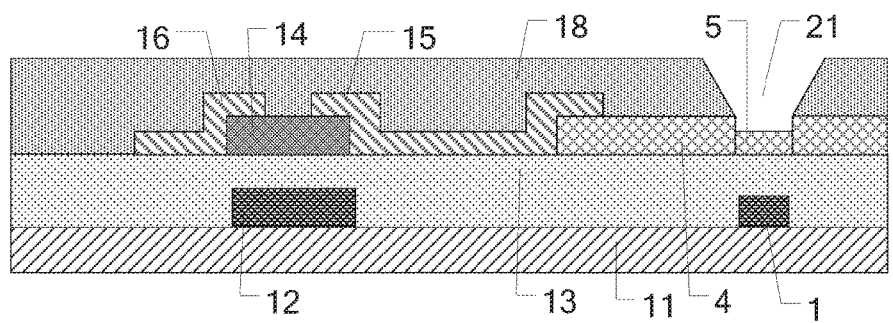

As illustrated in FIG. 4h, a layer of photoresist (not shown) is coated on the passivation layer film 18'; a passivation layer is formed by processes such as exposure, development, etching and stripping off the remaining photoresist; through holes 21 are formed in the passivation layer 18; at least portions of the connection units 5 are exposed at the through holes 21; and the exposed portions are removed in the subsequent etching process so as to disconnect the connection units 5 (namely being not electrically connected with the adjacent pixel electrodes). For example, at least portions of the through holes 21 correspond to, for example, are intersected or overlapped with, the gate lines between the adjacent pixel electrodes in a direction perpendicular to the base substrate. But the embodiment of the present disclosure is not limited thereto, as long as the through holes 21 can disconnect the connection units between the adjacent pixel electrodes to render the adjacent pixel electrodes to be electrically insulated.

Figure 4I:
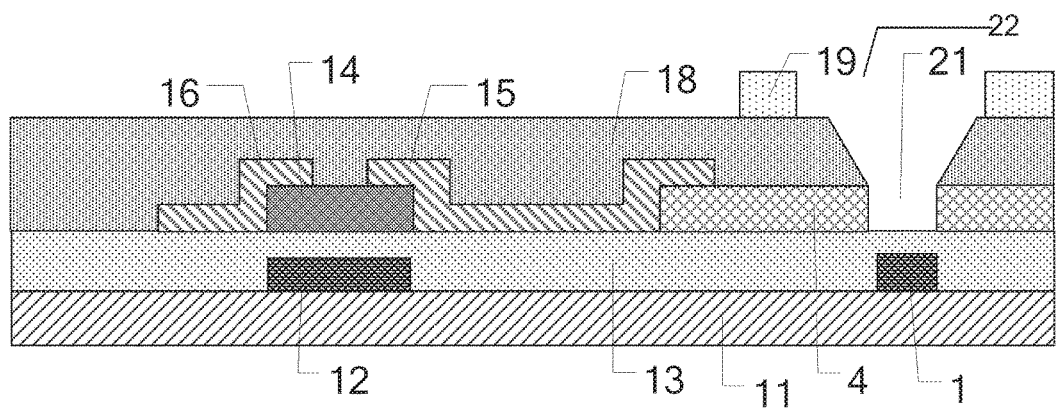

As illustrated in FIG. 4i, the manufacturing method provided by the embodiment of the present disclosure further comprises: forming common electrodes 19 opposite to the pixel electrodes 4 on the passivation layer 18. In a case that the common electrodes 19 are formed, the exposed portions of the connection units 5 are etched, so that the plurality of interconnected pixel electrodes 5 are disconnected. The process of forming the common electrodes 19 comprises: depositing a second transparent conductive film on the passivation layer 18, for example, depositing the second transparent conductive film in a magnetron sputtering method; coating a layer of photoresist (not shown) on the second transparent conductive film; and forming patterns of the common electrodes 19 by processes such as exposure, development, etching and stripping off the remaining photoresist, and disconnecting the connection units 5. In order to disconnect the connection units 5, the etching process must be performed at the through holes 21, so that not only the transparent conductive materials in the through holes for forming the common electrodes 19 are removed but also the portions of the connection units 5 exposed at the through holes 21 are further removed, and hence the connection units 5 are disconnected. Correspondingly, the common electrodes 19 are provided with openings 22 corresponding to the through holes in the direction perpendicular to the base substrate. The through holes 21, for example, are exposed by the openings 22.

For example, the common electrodes 19 may be made of transparent conductive materials such as ITO, IZO, IGO, GZO, carbon nanotube, ZnO, $In_2O_3$ or AZO.

The TFTs on the array substrate may be bottom-gate TFTs and may also be top-gate TFTs. Description is given in FIGS. 4a to 4i by taking the bottom-gate TFTs as an example. The process of forming the top-gate TFTs comprises: forming a gate insulating layer and gate electrodes on active layers, in which the gate insulating layer is disposed between the gate electrodes and the active layers and disposed below the gate electrodes, so as to isolate the gate electrodes and the active layers. Other structures and material of each layers are all consistent with the contents described in the bottom-gate TFTs, and detailed descriptions will be omitted here.

The above content takes the case of forming the pixel electrodes on the data lines and the source/drain electrode layer after the operation of forming the data lines and the source/drain electrode layer as an example. The manufacturing method provided by the embodiment of the present disclosure is also suitable for the case of forming the data lines and the source/drain electrode layer on the pixel electrodes after the operation of forming the pixel electrodes, as long as the sequences of the operation of forming the data lines and the source/drain electrode layer and the operation of forming the pixel electrodes are exchanged, and detailed descriptions will be omitted here.

Figure 6:
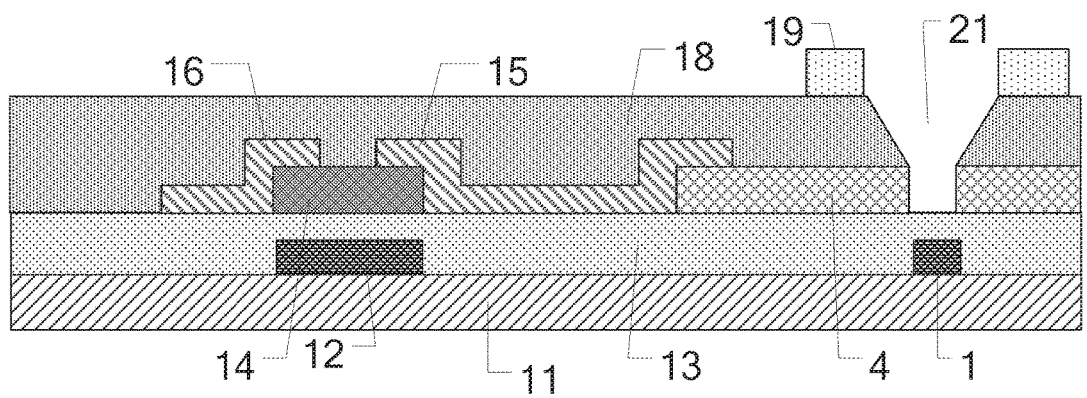
FIG. 6 is a schematic diagram of a section structure of an array substrate provided by an embodiment of the present disclosure.
Figure 7:
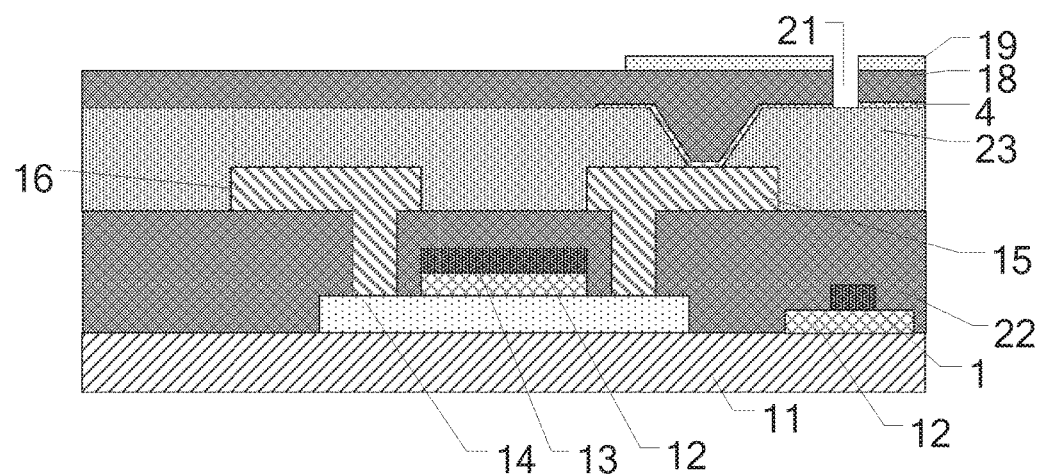
FIG. 7 is a schematic diagram of a section structure of another array substrate provided by an embodiment of the present disclosure.

At least one embodiment of the present disclosure further provides an array substrate. For example, FIG. 6 is a schematic diagram of a section structure of an array substrate provided by an embodiment of the present disclosure, and TFTs in the array substrate have bottom-gate structures. FIG. 7 is schematic diagram of a section structure of another array substrate provided by an embodiment of the present disclosure, and TFTs in the array substrate have top-gate structures.

As illustrated in FIGS. 6 and 7, the array substrate provided by at least one embodiment of the present disclosure comprises: a base substrate 11; a plurality of gate lines 1, a plurality of data lines (not shown) and a plurality of pixel electrodes 4 disposed on the base substrate 11; and a passivation layer 18 disposed on the plurality of pixel electrodes 4. The plurality of gate lines and the plurality of data lines are intersected with each other to define a plurality of pixel regions; the plurality of pixel electrodes are in the plurality of pixel regions respectively; the passivation layer 18 is provided with through holes 21 between adjacent pixel electrodes 4; and the adjacent pixel electrodes 4 are electrically insulated at the through holes 4, for example, the adjacent pixel electrodes 4 are disconnected at the through holes, namely the adjacent pixel electrodes 4 are electrically insulated.

The methods of electrically insulated of the adjacent pixel electrodes at the through holes comprise: disconnecting the plurality of interconnected pixel electrodes by an etching process or an ashing process; or performing a doping treatment on the portions which connect the adjacent pixel electrodes, so that the plurality of interconnected pixel electrodes are electrically insulated. Description will be given below by taking the case of the etching process or the ashing process to disconnect the plurality of interconnected pixel electrodes as an example.

As illustrated in FIGS. 6 and 7, at least portions of the through holes 21 correspond to the gate lines between the adjacent pixel electrodes in a direction perpendicular to the base substrate. But the embodiment of the present disclosure is not limited thereto, as long as the through holes 21 can disconnect the connection units between the adjacent pixel electrodes, so that the adjacent pixel electrodes cannot be electrically connected.

For example, the gate lines and the data lines may be made of a combination of Cu and other metals, for example, Cu/Mo, Cu/Ti, Cu/MoTi, Cu/MoW or Cu/MoNb; the gate metal layer may also be made of a Cr-base metal or a combination of Cr and other metals, for example, Cr/Mo, Cr/Ti or Cr/MoTi; and the gate metal layer may also be made of Al, Al alloy, etc.

For example, the pixel electrodes 4 and the connection units 5 may be made of transparent conductive materials such as ITO, IZO, IGO, GZO, carbon nanotube, ZnO, $In_2O_3$ and AZO. The pixel electrodes 4 and the connection units 5 are formed in a same patterning process.

In the structure of the array substrate as illustrated in FIG. 6, gate electrodes 12 are disposed on a base substrate 11; a gate insulating layer 3 is disposed on the gate electrodes; active layers 14 and pixel electrodes 4 are disposed on the gate insulating layer 13; source electrodes 16 and drain electrodes 15 are disposed on the active layers 14; the drain electrodes 15 are in contact with the pixel electrodes 4 directly; a passivation layer 18 is disposed on the source electrodes 16 and the drain electrodes 15; the passivation layer 18 is provided with a through hole 21 between two adjacent pixel electrodes 4; and the two adjacent pixel electrodes 4 are disconnected at the through hole 21.

In the structure of the array substrate as illustrated in FIG. 7, active layers 14 are disposed on a base substrate 11; a gate insulating layer 13 and gate electrodes 13 are disposed on the active layers 14; a first insulating layer 22 is disposed on the gate electrodes; a first connecting channel and a second connecting channel are formed by performing an etching process on the first insulating layer 22; source electrodes 16 and drain electrodes 15 are formed on the first insulating layer 22 and the source electrodes 16 and the drain electrodes 15 are connected with the active layers 14 through the first connecting channel and the second connecting channel respectively; a second insulating layer 23 is disposed on the source electrodes 16 and the drain electrodes 15; through holes are formed by etching the second insulating layer 23; pixel electrodes 4 are disposed on the second insulating layer 23 and connected with the drain electrodes 15 via the through holes; a passivation layer 18 is disposed on the pixel electrodes 4 and provided with through holes 21 between adjacent pixel electrodes 4; and the adjacent pixel electrodes 4 are disconnected at the through holes 21. Common electrodes 19 corresponding to the pixel electrodes 4 are disposed on the passivation layer 18. The common electrodes 19 are provided with openings corresponding to the through holes 21 in the direction perpendicular to the base substrate 11.

For example, the first insulating layer 22 and the second insulating layer 23 may be made of organic insulating materials or inorganic insulating materials or a laminated layer structure formed of organic insulating materials and inorganic insulating materials. For example, the insulating layer may be made of SiNx, SiOx or acrylic resin, etc.

The materials of other structures in the array substrates as illustrated in FIGS. 6 and 7 may refer to relevant contents described above and detailed descriptions will be omitted here.

For example, the array substrates as illustrated in FIGS. 6 and 7 may be applied to, for example, a liquid crystal display (LCD) panel, an organic light-emitting diode (OLED) display panel, an electronic paper display panel, etc.

For example, in the array substrates as illustrated in FIGS. 6 and 7, the pixel electrodes 4 are block electrodes, slit-like electrodes or comb-like electrodes, and the common electrodes 19 are comb-like electrodes.

Another embodiment of the present disclosure further provides a display device, which comprises any one of the above mentioned array substrates.

One example of the display device is an LCD device, which comprises an array substrate and an opposing substrate. The array substrate and the opposing substrate are arranged opposite to each other to form a liquid crystal cell, and liquid crystal materials are filled in the liquid crystal cell. The opposing substrate, for example, is a color filter (CF) substrate. Pixel electrodes of each pixel units of the array substrate are used for applying an electric field to control the rotation degree of the liquid crystal materials to achieve display.

Another example of the display device is an OLED display device, a laminated layer of organic luminescent materials is formed on the array substrate; and pixel electrodes of each pixel units are taken as anodes or cathodes and configured to drive the organic luminescent materials to emit light to achieve display.

Still another example of the display device is an electronic paper display device, an electronic ink layer is formed on an array substrate; and pixel electrodes of each pixel units are configured to apply voltage for driving charged microparticles in the electronic ink to move so as to achieve display.

Embodiments of the present disclosure provide an array substrate, a manufacturing method thereof, and a display device comprising the array substrate. In the manufacturing process of the array substrate, all the pixel electrodes are in series connection through the connection units, so as to form a linear electrode structure. In a case that there is a short circuit problem is generated between the data lines and the pixel electrodes or between the data lines the connection units, it is equivalent to a short circuit problem is generated between two wires; and in a case that signals on the data lines are transmitted on the pixel electrodes and the connection units, the intensity of the signals on the data lines is greatly reduced, so that it is convenient for the detection of the array substrate by a detection device. In addition, the connection units and the pixel electrodes are formed in a same layer and made of a same material, so the forming of the connection units does not require an additional processing operation. For example, after both a source/drain electrode layer (including source electrodes and drain electrodes) and the pixel electrodes are formed, the connection units may also be removed in the process of forming the passivation layer and common electrodes, so the pixel electrodes in the pixel regions can be independent to each other and operate normally, and no additional process is required.

There are also some points to be illustrated in the present disclosure:

(1) Drawings of the embodiments of the present disclosure only refer to structures related with the embodiments of the present disclosure, and other structures may refer to general design.

(2) In order to make it clear, in the drawings for illustrating the embodiment of the present disclosure, various components are magnified or reduced, that is, those drawings are not drawn according to actual proportion.

(3) In case of no conflict, the embodiments of the present disclosure and the features of the embodiments may be combined with each other to form new embodiments.

What are described above is related to the illustrative embodiments of the disclosure only and not limitative to the scope of the disclosure; the scopes of the disclosure are defined by the accompanying claims.

The present application claims priority of the Chinese Patent Application No. 201710004838.1, filed on Jan. 4, 2017, the entire disclosure of which is incorporated herein by reference as part of the present application.

What is claimed is:

1. A method for manufacturing an array substrate, comprising:
providing a base substrate; and
forming a plurality of gate lines, a plurality of data lines, and a plurality of pixel electrodes on the base substrate, wherein the plurality of gate lines and the plurality of data lines are intersected with each other to define a plurality of pixel regions, the plurality of pixel electrodes are in the plurality of pixel regions respectively; and forming of the plurality of pixel electrodes comprises:
    depositing a first transparent conductive film on the base substrate;
    forming the plurality of pixel electrodes and a connection unit for connecting adjacent pixel electrodes by patterning the first transparent conductive film;
    forming a passivation layer on the plurality of pixel electrodes, and patterning the passivation layer to expose at least a portion of the connection unit; and
    processing the exposed portion of the connection unit to render the plurality of interconnected pixel electrodes to be electrically insulated.

2. The manufacturing method according to claim 1, wherein the connection unit is intersected or overlapped with one of the gate lines disposed between the adjacent pixel electrodes.

3. The manufacturing method according to claim 1, wherein the pixel electrodes are block electrodes, slit-like electrodes or comb-like electrodes.

4. The manufacturing method according to claim 2, wherein the pixel electrodes are block electrodes, slit-like electrodes or comb-like electrodes.

5. The manufacturing method according to claim 2, further comprising: forming a source electrode and a drain electrode on the base substrate, wherein the source electrode is connected with one of the data lines, and the drain electrode is connected with one of the pixel electrodes.

6. The manufacturing method according to claim 1, further comprising: forming a common electrode on the passivation layer.

7. The manufacturing method according to claim 6, further comprising: forming a through hole in the passivation layer, wherein at least the portion of the connection unit is exposed at the through hole.

8. The manufacturing method according to claim 7, wherein the portion of the connection unit exposed by the through hole is processed to render the plurality of interconnected pixel electrodes to be electrically insulated.

9. The manufacturing method according to claim 2, further comprising: forming a through hole in the passivation layer, wherein at least the portion of the connection unit is exposed at the through hole.

10. The manufacturing method according to claim 9, wherein the portion of the connection unit exposed by the through hole is processed to render the plurality of interconnected pixel electrodes to be electrically insulated.

11. The manufacturing method according to claim 3, further comprising: forming a through hole in the passivation layer, wherein at least the portion of the connection unit is exposed at the through hole.

12. The manufacturing method according to claim 11, wherein the portion of the connection unit exposed by the through hole is processed to render the plurality of interconnected pixel electrodes are electrically insulated.

* * * * *